US012627305B2

(12) United States Patent
Nien

(10) Patent No.: US 12,627,305 B2
(45) Date of Patent: May 12, 2026

(54) SIGNAL RECOVERY SYSTEM AND STORAGE DEVICE

(71) Applicant: Elite Semiconductor Microelectronics Technology Inc., Hsinchu (TW)

(72) Inventor: Shu-Han Nien, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 9 days.

(21) Appl. No.: 18/631,037

(22) Filed: Apr. 9, 2024

(65) Prior Publication Data

US 2025/0317149 A1 Oct. 9, 2025

(51) Int. Cl.
*H03L 7/099* (2006.01)
*H03K 19/20* (2006.01)
*H03L 7/08* (2006.01)

(52) U.S. Cl.
CPC .......... *H03L 7/0992* (2013.01); *H03K 19/20* (2013.01); *H03L 7/0807* (2013.01)

(58) Field of Classification Search
CPC . H03L 7/0807; H03L 7/0992; H04L 27/2271; H04L 27/2275; H03K 19/20
USPC ........ 375/326, 328, 373, 374, 376; 327/150, 327/151, 159, 160
See application file for complete search history.

(56) References Cited

U.S. PATENT DOCUMENTS

| | | | | |
|---|---|---|---|---|
| 2006/0050827 A1* | 3/2006 | Saeki | ...................... | H03M 9/00 |
| | | | | 375/362 |
| 2007/0172006 A1* | 7/2007 | Lee | .......................... | H04L 7/033 |
| | | | | 375/355 |
| 2008/0056423 A1* | 3/2008 | Jeon | ...................... | H03L 7/0995 |
| | | | | 375/359 |
| 2010/0034330 A1* | 2/2010 | Weng | ...................... | H04L 7/033 |
| | | | | 375/357 |
| 2022/0407677 A1* | 12/2022 | Weng | ...................... | H02M 3/07 |

* cited by examiner

*Primary Examiner* — Young T. Tse
(74) *Attorney, Agent, or Firm* — Winston Hsu

(57) ABSTRACT

A signal recovery system includes multiple frequency dividers, multiple signal recovery circuits, and a data signal generating circuit. The multiple frequency dividers perform a frequency dividing operation upon a clock signal and a data strobe signal, respectively, to generate a set of frequency-divided clock signals and a set of frequency-divided data strobe signals. The multiple signal recovery circuits perform a signal recovery operation upon the set of frequency-divided clock signals and the set of frequency-divided data strobe signals, respectively, to generate a recovered clock signal and a recovered data strobe signal. The data signal generating circuit generates a data signal according to the recovered clock signal and the recovered data strobe signal, for indicating whether a rising edge of the data strobe signal is located at a first level or a second level of the clock signal, wherein the first level is higher than the second level.

15 Claims, 6 Drawing Sheets

SIGNAL RECOVERY SYSTEM AND STORAGE DEVICE

BACKGROUND OF THE INVENTION

1. Field of the Invention

The present invention is related to a double data rate (DDR) synchronous dynamic random access memory (SDRAM), and more particularly, to a signal recovery system that can perform a write leveling operation by frequency division and signal recovery, and an associated storage device.

2. Description of the Prior Art

With the development of the DDR SDRAM, frequency dividing operations are usually performed upon a clock signal with a high-speed frequency and a data strobe (DQS) signal to generate multiple frequency-divided signals clock and multiple frequency-divided DQS signals, for performing a data writing operation. For the LPDDR4, during a write leveling operation, the DDR SDRAM receives the clock signal and the DQS signal from a memory controller, and generate and transmit a data (DQ) signal back to the memory controller according to the clock signal and the DQS signal, for indicating whether a rising edge of the DQS signal is located at a high level or a low level of the clock signal. The memory controller may then determine whether to delay the DQS signal according to the DQ signal for successfully performing the data writing operation. For a conventional storage device including the memory controller and the DDR SDRAM, the clock signal and the DQS signal may be used to perform the write leveling operation through multiple delay circuits (e.g., multiple inverters) that imitate a delay of a normal data writing path. Some problems may occur, however. Under a condition that process, voltage, and temperature (PVT) varies, and the LPDDR4 specification only allows tDOSS to have a tolerance value of 1±0.25 tck (clock cycle time; i.e., at the fastest current clock speed, the clock cycle time tck is 0.46 nanoseconds (ns)), there may be a difference between a delay of the delay circuits and that of the normal data writing path, thereby causing errors in the subsequent data writing operation. As a result, a novel signal recovery system that can perform the write leveling operation by a recovered clock signal and a recovered DQS signal obtained by performing signal recovery operations upon the frequency-divided clock signals and the frequency-divided DQS signals, and an associated storage device are urgently needed.

SUMMARY OF THE INVENTION

It is therefore one of the objectives of the present invention to provide a signal recovery system that can perform a write leveling operation by frequency division and signal recovery, and an associated storage device, to address the above-mentioned issues.

According to an embodiment of the present invention, a signal recovery system is provided. The signal recovery system may comprise multiple frequency dividers, multiple signal recovery circuits, and a data signal generating circuit. The multiple frequency dividers may be arranged to perform a frequency dividing operation upon a clock signal and a data strobe signal, respectively, to generate a set of frequency-divided clock signals and a set of frequency-divided data strobe signals. The multiple signal recovery circuits may be arranged to perform a signal recovery operation upon the set of frequency-divided clock signals and the set of frequency-divided data strobe signals, respectively, to generate a recovered clock signal and a recovered data strobe signal. The data signal generating circuit may be arranged to generate a data signal according to the recovered clock signal and the recovered data strobe signal, for indicating whether a rising edge of the data strobe signal is located at a first level or a second level of the clock signal, wherein the first level is higher than the second level.

According to an embodiment of the present invention, a storage device is provided. The storage device may comprise a memory controller, a memory, multiple signal recovery circuits, and a data signal generating circuit. The memory may comprise multiple frequency dividers, wherein the multiple frequency dividers may be arranged to receive a clock signal and a data strobe signal from the memory controller, and perform a frequency dividing operation upon the clock signal and the data strobe signal, respectively, to generate a set of frequency-divided clock signals and a set of frequency-divided data strobe signals. The multiple signal recovery circuits may be arranged to perform a signal recovery operation upon the set: of frequency-divided clock signals and the set of frequency-divided data strobe signals, respectively, to generate a recovered clock signal and a recovered data strobe signal. The data signal generating circuit may be arranged to generate a data signal according to the recovered clock signal and the recovered data strobe signal, and transmit the data signal to the memory controller, for indicating whether a rising edge of the data strobe signal is located at a first level or a second level of the clock signal, wherein the first level is higher than the second level.

One of the benefits of the present invention is that, compared with a case where a clock signal and a DQS signal are used to perform a write leveling operation through multiple delay circuits (e.g., multiple inverters) that imitate a delay of a normal data writing path, the signal recovery system of the present invention performs the write leveling operation by frequency division within the DDR SDRAM and signal recovery operations performed upon frequency-divided signals, which can avoid errors caused by process, voltage, and temperature (PVT) variation for the delay circuits (e.g., skew margin reduction between the DQS signal and the clock signal during a data writing operation). In this way, the accuracy of the data writing operation can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
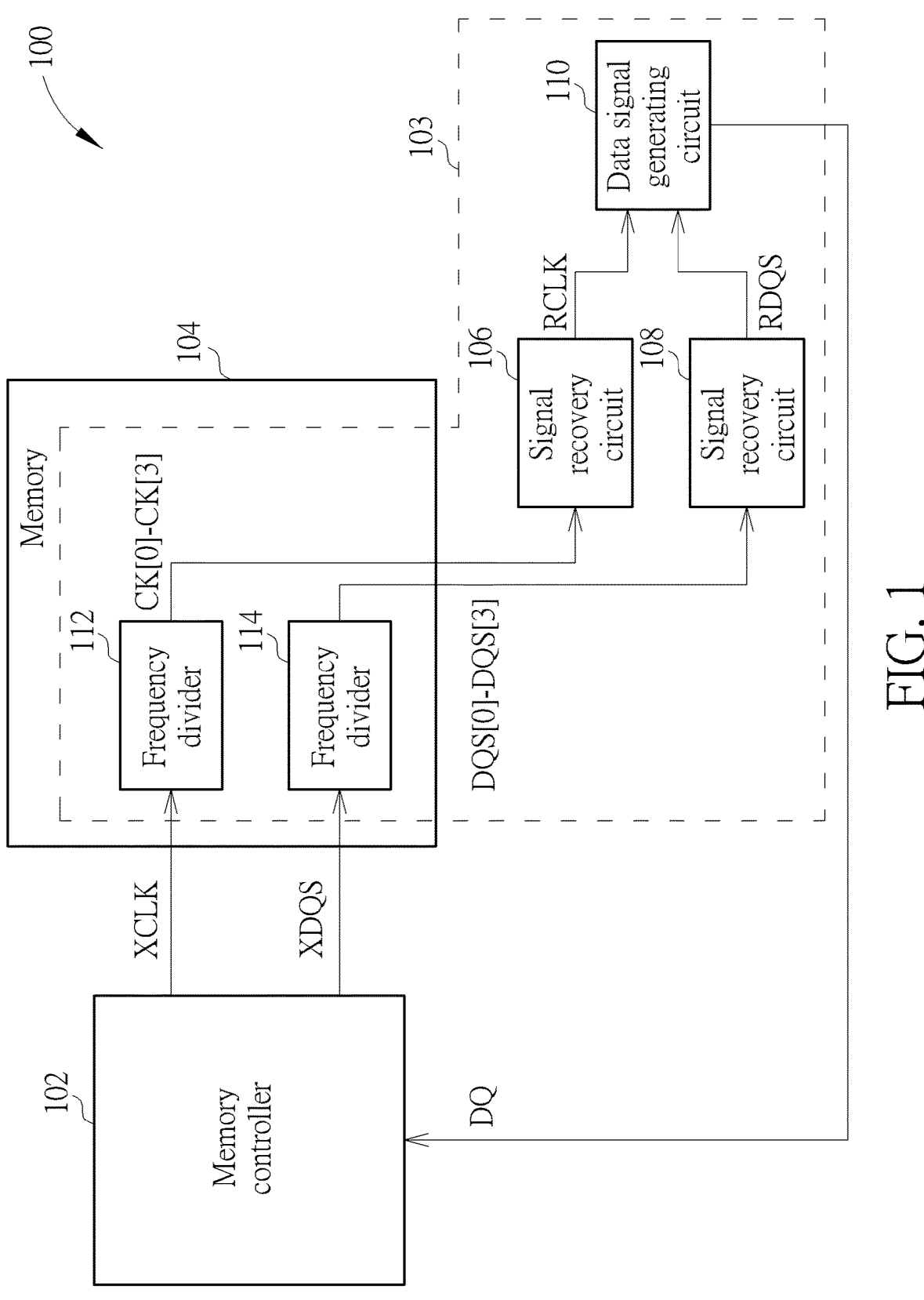
FIG. 1 is a diagram illustrating a storage device according to an embodiment of the present invention.

FIG. 1 is a diagram illustrating a storage device 100 according to an embodiment of the present invention. As shown in FIG. 1, the storage device 100 may include a memory controller 102, a memory (e.g. a double data rate (DDR) synchronous dynamic random access memory (SDRAM)) 104, multiple signal recovery circuits 106 and 108, and a data signal generating circuit 110, wherein the memory 104 may include multiple frequency dividers 112 and 114; and the frequency dividers 112 and 114, the signal recovery circuits 106 and 108, and the data signal generating circuit 110 may be regarded as a signal recovery system 103. In response to the memory 104 being in a write leveling mode, the memory controller 102 may transmit a clock signal XCLK and a data strobe (DQS) signal XDQS to the memory 104 (more particularly, the frequency dividers 112 and 114 of the memory 104). The frequency divider 112 may be arranged to perform a frequency dividing operation upon the clock signal XCLK to generate a set of frequency-divided clock signals CK[0]-CK[M]. The frequency divider 114 may be arranged to perform a frequency dividing operation upon the DQS signal XDQS to generate a set of frequency-divided DQS signals DQS[0]-DQS[N].

In this embodiment, the frequency divider 112 may perform a frequency dividing operation with a divisor "2" upon the clock signal XCLK to generate the set of frequency-divided clock signals CK[0]-CK[3] (i.e. M=3) with different phases, wherein a frequency of each frequency-divided clock signal in the set of frequency-divided clock signals CK[0]-CK[3] is half a frequency of the clock signal XCLK. The frequency divider 114 may perform a frequency dividing operation with a divisor "2" upon the DQS signal XDQS to generate the set of frequency-divided DQS signals DQS[0]-DQS[3] (i.e. N=3) with different phases, wherein a frequency of each frequency-divided DQS signal in the set of frequency-divided DQS signals DQS[0]-DQS[3] is half a frequency of the DQS signal XDQS. This is for illustration only, and the present invention is not limited thereto. In some embodiments, the frequency divider 112 may perform a frequency dividing operation with another divisor (e.g. "4") upon the clock signal XCLK to generate the set of frequency-divided clock signals, and the frequency divider 114 may perform a frequency dividing operation with another divisor (e.g. "4") upon the DQS signal XDQS to generate the set of frequency-divided DQS signals.

The signal recovery circuit 106 may be arranged to perform a signal recovery operation upon the set of frequency-divided clock signals CK[0]-CK[3] to generate a recovered clock signal RCLK, wherein a duty cycle of the recovered clock signal RCLK is similar to or equal to that of the clock signal XCLK. The signal recovery circuit 108 may be arranged to perform a signal recovery operation upon the set of frequency-divided DQS signals DQS[0]-DQS[3] to generate a recovered DQS signal RDQS, wherein a duty cycle of the recovered DQS signal RDQS is similar to or equal to that of the DQS signal XDQS. The data signal generating circuit 110 may be arranged to generate and transmit a data signal DQ to the memory controller 102 according to the recovered clock signal RCLK and the recovered DQS signal RDQS, for indicating whether a rising edge of the DQS signal XDQS is located at a high level (e.g., a logic value "1") or a low level (e.g., a logic value "0") of the clock signal XCLK. The memory controller 102 may then determine whether to delay the DQS signal XDQS according to the data signal DO for successfully performing a data writing operation.

Figure 2:
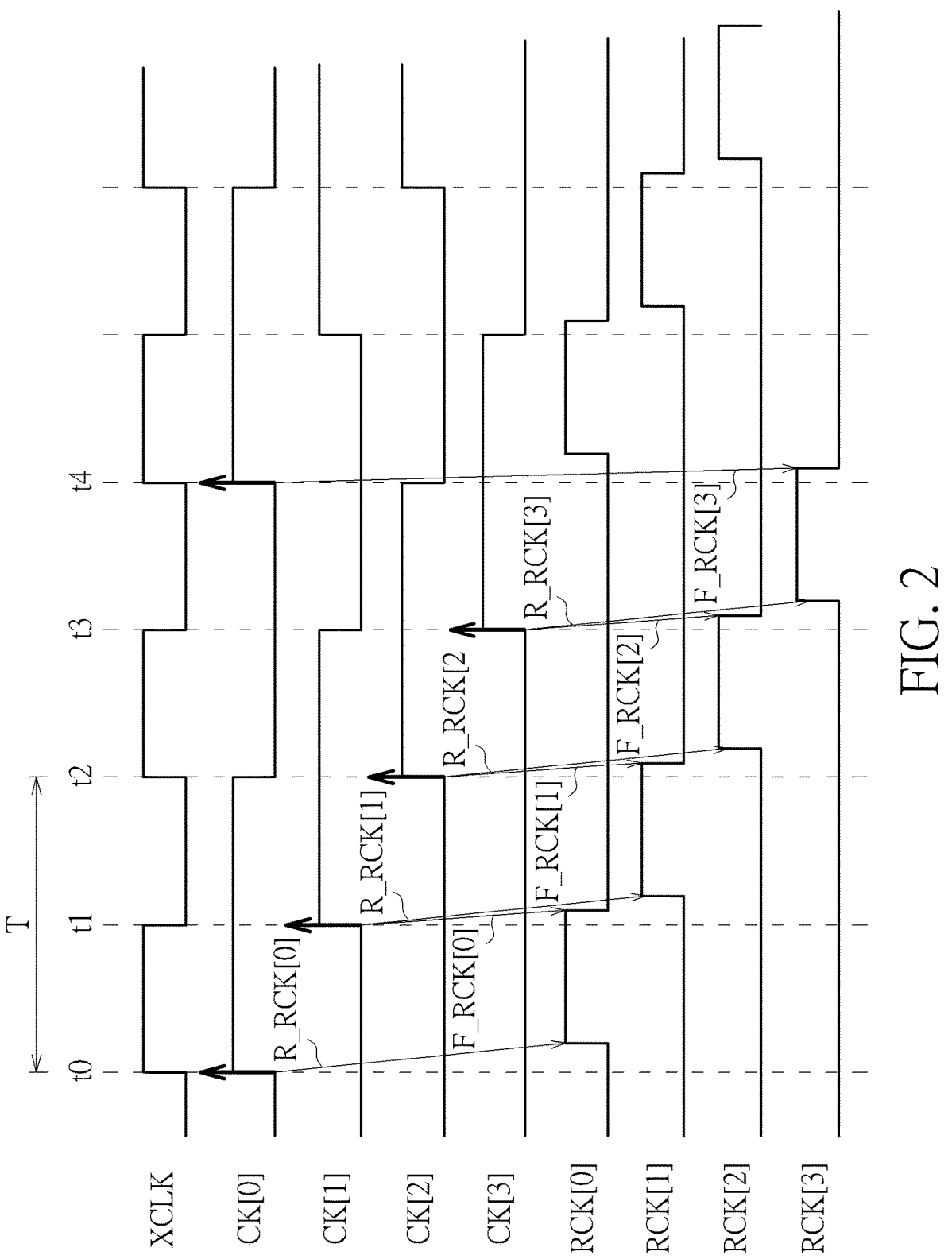
FIG. 2 is a timing diagram of associated signals of a signal recovery circuit according to an embodiment of the present invention.

For respective signal recovery operations of the signal recovery circuits 106 and 108, since the signal recovery operation of the signal recovery circuit 106 for the frequency-divided clock signals CK[0]-CK[3] is similar to that of the signal recovery circuit 108 for the frequency-divided DQS signal DQS[0]-DQS[3], only the signal recovery operation of the signal recovery circuit 106 will be described below, and those skilled in the art can easily understand the signal recovery operation of the signal recovery circuit 108 by the following descriptions. FIG. 2 is a timing diagram of associated signals of the signal recovery circuit 106 according to an embodiment of the present invention. As shown in FIG. 2, the clock signal XCLK is a square signal with a period "T" (e.g., a time period from a time point to to a time point t2), and each of the frequency-divided clock signals CK[0]-CK[3] is a square signal with a period "2T" (e.g., a time period from a time point to to a time point t4), wherein the frequency-divided clock signal CK[0] is generated according to a first rising edge of the clock signal XCLK at the time point to (e.g., a first rising edge of the frequency-divided clock signal CK[0] aligns with the first rising edge of the clock signal XCLK at the time point t0), the frequency-divided clock signal CK[1] is generated according to a first falling edge of the clock signal XCLK at a time point t1 (e.g., a first rising edge of the frequency-divided clock signal CK[1] aligns with the first falling edge of the clock signal XCLK at the time point t1), the frequency-divided clock signal CK[2] is generated according to a second rising edge of the clock signal XCLK at the time point t2 (e.g., a first rising edge of the frequency-divided clock signal CK[2] aligns with the second rising edge of the clock signal XCLK at the time point t2), and the frequency-divided clock signal CK[3] is generated according to a second falling edge of the clock signal XCLK at a time point t3 (e.g., a first rising edge of the frequency-divided clock signal CK[3] aligns with the second falling edge of the clock signal XCLK at the time point t3).

The signal recovery circuit 106 may generate multiple recovery signals RCK[0]-RCK[3] according to rising edges of the frequency-divided clock signals CK[0]-CK[3], and generate the recovered clock signal RCK according to the recovery signals RCK[0]-RCK[3], wherein each of the recovery signals RCK[0]-RCK[3] is generated according to rising edges of two of the frequency-divided clock signals CK[0]-CK[3]. For example, the recovery signal RCK[0] is generated according to rising edges of the frequency-divided clock signals CK[0] and CK[1], the recovery signal RCK[1] is generated according to rising edges of the frequency-divided clock signals CK[1] and CK[2], recovery signal RCK[2] is generated to rising edges according of the frequency-divided clock signals CK[2] and CK[3], and recovery signal RCK[3] is generated according to rising edges of the frequency-divided clock signals CK[0] and CK[3]. In detail, the recovery signal RCK[0] may toggle from a low level (e.g., the logic value "0") to a high level (e.g., the logic value "1") in response to the rising edge of the frequency-divided clock signal CK[0] (labeled as "R_RCK[0]" in FIG. 2), and may toggle from the high level to the low level in response to the rising edge of the frequency-divided clock signal CK[1] (labeled as "F_RCK[0]" in FIG. 2). In other words, only when the frequency-divided clock signal CK[0] is at the high level and the frequency-divided clock signal CK[1] is at the low level, the recovery signal RCK[0] will at the high level. In other situations (i.e., both the frequency-divided clock signals CK[0] and CK[1] being at the low level, the frequency-divided clock signals CK[0] being at the low level and the frequency-divided clock signals CK[1] being at the high level, and both the frequency-divided clock signals CK[0] and CK[1] being at the high level), the recovery signal RCK[0] will at the low level.

The recovery signal RCK[1] may toggle from the low level to the high level in response to the rising edge of the frequency-divided clock signal CK[1] (labeled as "R_RCK [1]" in FIG. 2), and may toggle from the high level to the low level in response to the rising edge of the frequency-divided clock signal CK[2] (labeled as "F_RCK[1]" in FIG. 2). In other words, only when the frequency-divided clock signal CK[1] is at the high level and the frequency-divided clock signal CK[2] is at the low level, the recovery signal RCK[1] will at the high level. In other situations (i.e., both the frequency-divided clock signals CK[1] and CK[2] being at the low level, the frequency-divided clock signals CK[1] being at the low level and the frequency-divided clock signals CK[2] being at the high level, and both the frequency-divided clock signals CK[1] and CK[2] being at the high level), the recovery signal RCK[1] will at the low level.

The recovery signal RCK[2] may toggle from the low level to the high level in response to the rising edge of the frequency-divided clock signal CK[2] (labeled as "R_RCK [2]" in FIG. 2), and may toggle from the high level to the low level in response to the rising edge of the frequency-divided clock signal CK[3] (labeled as "F_RCK[2]" in FIG. 2). In other words, only when the frequency-divided clock signal CK[2] is at the high level and the frequency-divided clock signal CK[3] is at the low level, the recovery signal RCK[2] will at the high level. In other situations (i.e., both the frequency-divided clock signals CK[2] and CK[3] being at the low level, the frequency-divided clock signals CK[2] being at the low level and the frequency-divided clock signals CK[3] being at the high level, and both the frequency-divided clock signals CK[2] and CK[3] being at the high level), the recovery signal RCK[2] will at the low level.

The recovery signal RCK[3] may toggle from the low level to the high level in response to the rising edge of the frequency-divided clock signal CK[3] (labeled as "R_RCK [3]" in FIG. 2), and may toggle from the high level to the low level in response to the rising edge of the frequency-divided clock signal CK[0] (labeled as "F_RCK[3]" in FIG. 2). In other words, only when the frequency-divided clock signal CK[3] is at the high level and the frequency-divided clock signal CK[0] is at the low level, the recovery signal RCK[3] will at the high level. In other situations (i.e., both the frequency-divided clock signals CK[3] and CK[0] being at the low level, the frequency-divided clock signals CK[3] being at the low level and the frequency-divided clock signals CK[0] being at the high level, and both the frequency-divided clock signals CK[3] and CK[0] being at the high level), the recovery signal RCK[3] will at the low level.

Figure 3:
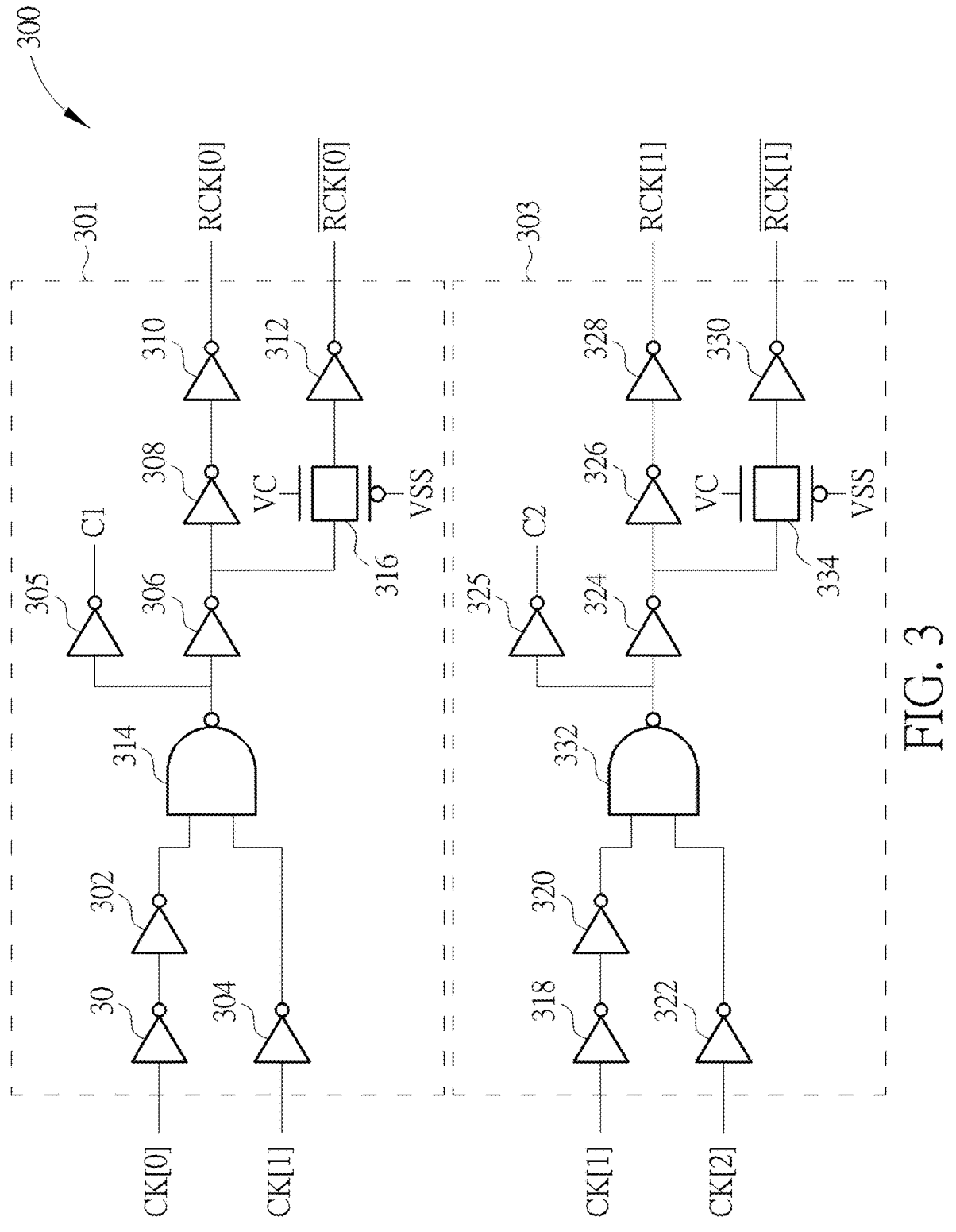
FIG. 3 is a diagram illustrating a first part of a signal recovery circuit according to an embodiment of the present invention.
Figure 4:
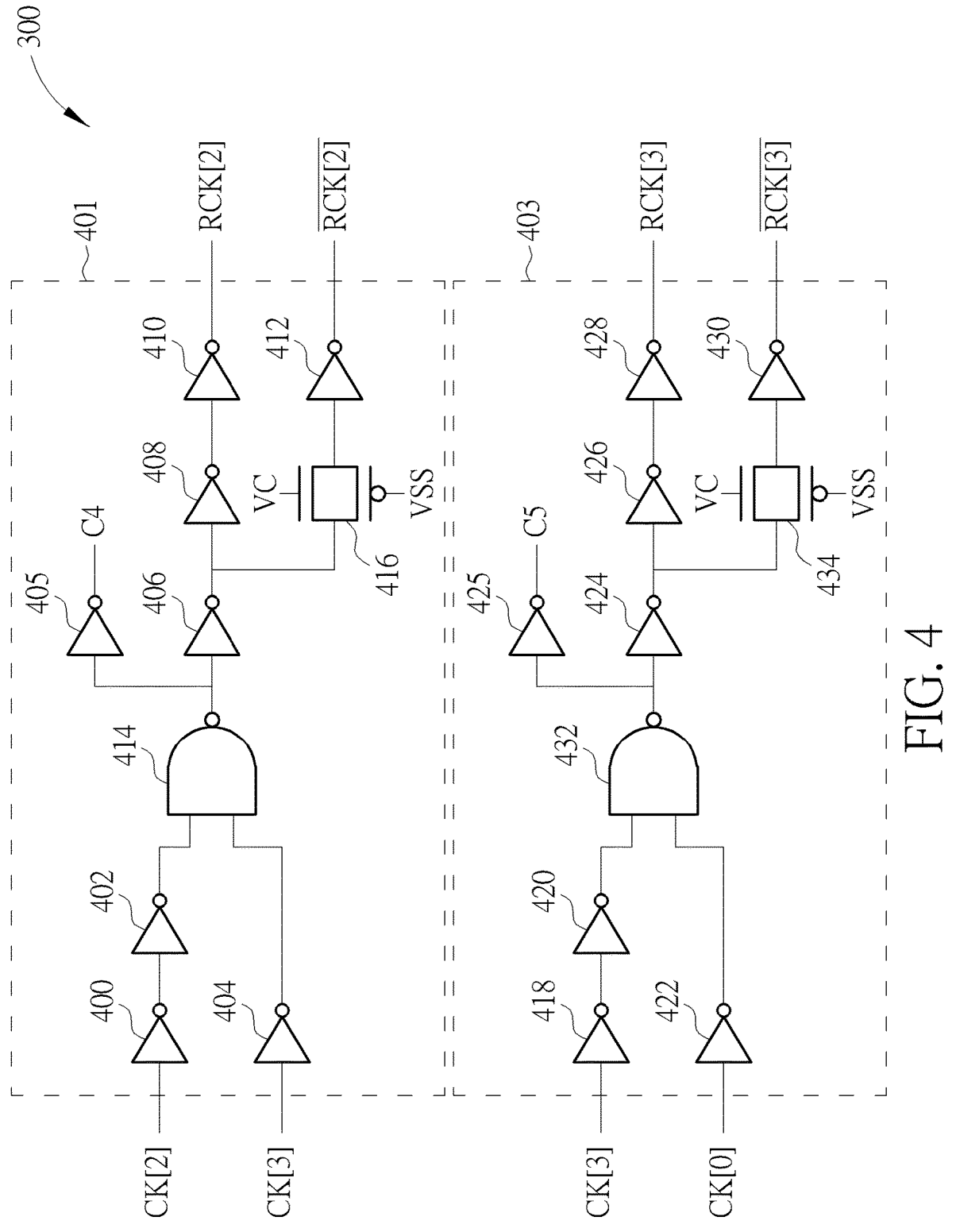
FIG. 4 is a diagram illustrating a second part of a signal recovery circuit according to an embodiment of the present invention.

Please refer to FIG. 3 in conjunction with FIG. 4. FIG. 3 is a diagram illustrating a first part of a signal recovery circuit 300 according to an embodiment of the present invention. FIG. 4 is a diagram illustrating a second part of the signal recovery circuit 300 according to an embodiment of the present invention, wherein the signal recovery circuit 106 shown in FIG. 1 may be implemented by the signal recovery circuit 300. As shown in FIG. 3 and FIG. 4, the signal recovery circuit 300 may include multiple logical combination circuits 301, 303, 401, and 403, for generating the recovery signals RCK[0]-RCK[3], respectively.

The logical combination circuit 301 may be arranged to receive the frequency-divided clock signals CK[0] and CK[1] for generating the recovery signal RCK[0], and may include multiple inverters 30, 302, 304, 305, 306, 308, 310, and 312, an NAND gate circuit 314, and a transmission gate circuit 316. The NAND gate circuit 314 has a first input port for receiving the frequency-divided clock signal CK[0] through the inverters 30 and 302, a second input port for receiving an inverted version of the frequency-divided clock signal CK[1] through the inverter 304, and an output port. In order to avoid signal conflict, a number of inverters for transmitting the frequency-divided clock signal CK[0] to the NAND gate circuit 314 (e.g., the inverters 30 and 302) is larger than that of inverters for transmitting the frequency-divided clock signal CK[1] to the NAND gate circuit 314 (e.g., the inverter 304), so that the timing when the frequency-divided clock signal CK[1] reaches the NAND gate circuit 314 is earlier than the timing when the frequency-divided clock signal CK[0] reaches the NAND gate circuit 314.

An inverted version of an output result of the NAND gate circuit 314 may be generated through the inverters 306, 308, and 310 for acting as the recovery signal RCK[0]. For subsequent processing, the output result of the NAND gate circuit 314 may be transmitted to a subsequent circuit through the inverter 306, the transmission gate circuit 316, and the inverter 312, for acting as an inverted version of the recovery signal RCK[0] (labeled as "$\overline{RCK[0]}$" in FIG. 3). For example, the inverter 306 has a first terminal coupled to the output port of the NAND gate circuit 314 and a second terminal. The transmission gate circuit 316 may be a complementary metal-oxide-semiconductor (CMOS) including an N-type transistor and a P-type transistor, and has an input port coupled to the second terminal of the inverter 306 and an output port, wherein a gate terminal of the N-type transistor is coupled to a voltage signal VC with the high level, and a gate terminal of the P-type transistor is coupled to a voltage signal VSS with the low level (e.g., the voltage signal VSS may be a grounding voltage signal GND), that is, an output result of the inverter 306 is transmitted from the input port to the output port of the transmission gate circuit 316. The inverter 312 has a first terminal coupled to the output port of the transmission gate circuit 316 and a second terminal, wherein the inverted version of the recovery signal RCK[0] is output from the second terminal of the inverter 312. In addition, the inverter 305 may be coupled to the output port of the NAND gate circuit 314, and may be arranged to generate an inverted version of the output result of the NAND gate circuit 314 as a control signal C1.

The logical combination circuit 303 may be arranged to receive the frequency-divided clock signals CK[1] and CK[2] for generating the recovery signal RCK[1], and may include multiple inverters 318, 320, 322, 324, 325, 326, 328, and 330, an NAND gate circuit 332, and a transmission gate circuit 334. The NAND gate circuit 332 has a first input port for receiving the frequency-divided clock signal CK[1] through the inverters 318 and 320, a second input port for receiving an inverted version of the frequency-divided clock signal CK[2] through the inverter 322, and an output port. In order to avoid signal conflict, a number of inverters for transmitting the frequency-divided clock signal CK[1] to the NAND gate circuit 332 (e.g., the inverters 318 and 320) is larger than that of inverters for transmitting the frequency-divided clock signal CK[2] to the NAND gate circuit 332

(e.g., the inverter 322), so that the timing when the frequency-divided clock signal CK[2] reaches the NAND gate circuit 332 is earlier than the timing when the frequency-divided clock signal CK[1] reaches the NAND gate circuit 332.

An inverted version of an output result of the NAND gate circuit 332 may be generated through the inverters 324, 326, and 328 for acting as the recovery signal RCK[1]. For subsequent processing, the output result of the NAND gate circuit 314 may be transmitted to a subsequent circuit through the inverter 324, the transmission gate circuit 334, and the inverter 330, for acting as an inverted version of the recovery signal RCK[1] (labeled as "$\overline{RCK[1]}$" in FIG. 3). For example, the inverter 324 has a first terminal coupled to the output port of the NAND gate circuit 332 and a second terminal. The transmission gate circuit 334 is composed of an N-type transistor and a P-type transistor, and has an input port coupled to the second terminal of the inverter 324 and an output port, wherein a gate terminal of the N-type transistor is coupled to the voltage signal VC, and a gate terminal of the P-type transistor is coupled to the voltage signal VSS (i.e., an output result of the inverter 324 is transmitted from the input port to the output port of the transmission gate circuit 334). The inverter 330 has a first terminal coupled to the output port of the transmission gate circuit 334 and a second terminal, wherein the inverted version of the recovery signal RCK[1] is output from the second terminal of the inverter 330. In addition, the inverter 325 may be coupled to the output port of the NAND gate circuit 332, and may be arranged to generate an inverted version of the output result of the NAND gate circuit 332 as a control signal C2.

The logical combination circuit 401 may include multiple inverters 400, 402, 404, 405, 406, 408, 410, and 412, an NAND gate circuit 414, and a transmission gate circuit 416, wherein an inverted version of an output result of the NAND gate circuit 414 is obtained by the inverter 405 as a control signal C4. Since the operations of the logical combination circuit 401 for generating the recovery signal RCK[2] and an inverted version of the recovery signal RCK[2] (labeled as "$\overline{RCK[2]}$" in FIG. 4) according to the frequency-divided clock signals CK[2] and CK[3] are similar to that of the logical combination circuit 301, further descriptions are not repeated in detail here for brevity.

The logical combination circuit 403 may include multiple inverters 418, 420, 422, 424, 425, 426, 428, and 430, an NAND gate circuit 432, and a transmission gate circuit 434, wherein an inverted version of an output result of the NAND gate circuit 432 is obtained by the inverter 425 as a control signal C5. Since the operations of the logical combination circuit 403 for generating the recovery signal RCK[3] and an inverted version of the recovery signal RCK[3] (labeled as "$\overline{RCK[3]}$" in FIG. 4) according to the frequency-divided clock signals CK[3] and CK[0] are similar to that of the logical combination circuit 301, further descriptions are not repeated in detail here for brevity.

Figure 5:
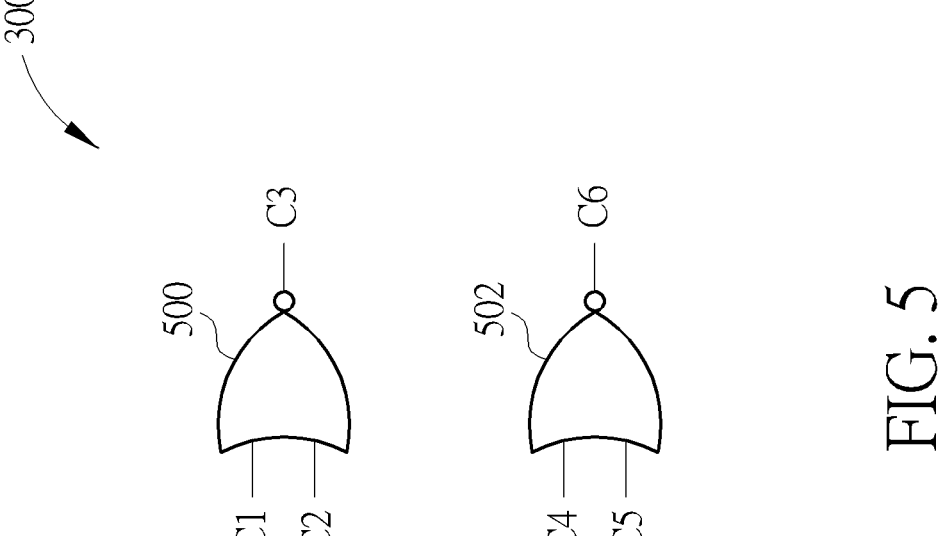
FIG. 5 is a diagram illustrating a third part of a signal recovery circuit according to an embodiment of the present invention.

FIG. 5 is a diagram illustrating a third part of the signal recovery circuit 300 according to an embodiment of the present invention. As shown in FIG. 5, the signal recovery circuit 300 may further include multiple NOR gate circuits 500 and 502. The NOR gate circuit 500 has a first input port for receiving the control signal C1 from the logical combination circuit 301 and a second input port for receiving the control signal C2 from the logical combination circuit 303 and an output port, wherein a control signal C3 is transmitted from the output port of the NOR gate circuit 500 for subsequent processing. The NOR gate circuit 502 has a first input port for receiving the control signal C4 from the logical combination circuit 401 and a second input port for receiving the control signal C5 from the logical combination circuit 403 and an output port, wherein a control signal C6 is transmitted from the output port of the NOR gate circuit 502 for subsequent processing.

Figure 6:
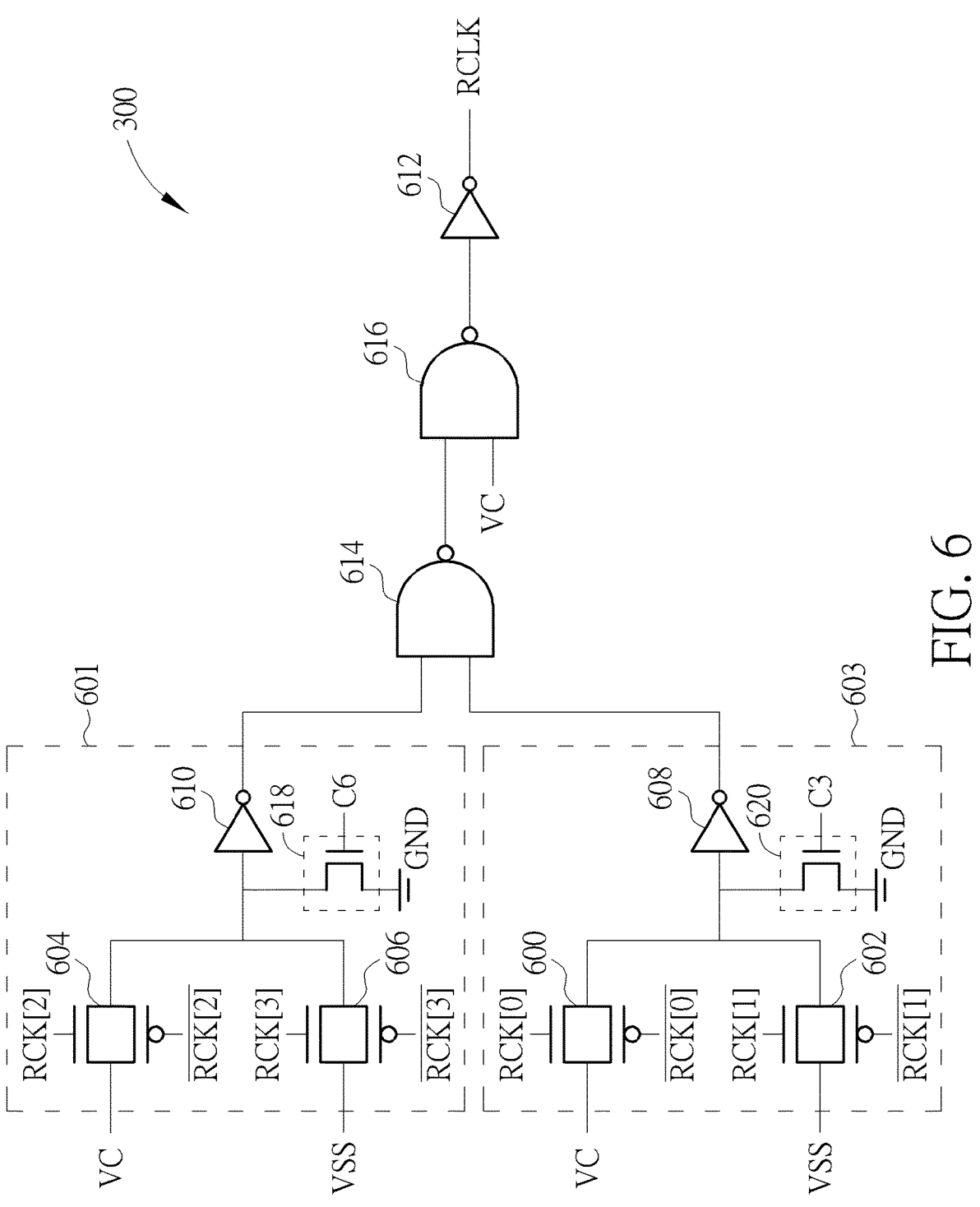
FIG. 6 is a diagram illustrating a fourth part of a signal recovery circuit according to an embodiment of the present invention.

FIG. 6 is a diagram illustrating a fourth part of the signal recovery circuit 300 according to an embodiment of the present invention. As shown in FIG. 6, the signal recovery circuit 300 may further include multiple signal transmission circuits 601 and 603, multiple NAND gate circuits 614 and 616, and an inverter 612. The signal transmission circuit 603 may be arranged to determine whether to transmit the voltage signal VC or the voltage signal VSS according to the recovery signals RCK[0] and RCK[1]. Specifically, the signal transmission circuit 603 may include multiple transmission gate circuits 600 and 602, an inverter 608, and an N-type transistor 620, wherein each of the transmission gate circuits 600 and 602 may be a CMOS including an N-type transistor and a P-type transistor. The transmission gate circuit 600 has an input port for receiving the voltage signal VC, a control port for receiving the recovery signal RCK[0] (e.g., a gate terminal of the N-type transistor receiving the recovery signal RCK[0], and a gate terminal of the P-type transistor receiving the inverted version of the recovery signal RCK[0] (labeled as "$\overline{RCK[0]}$" in FIG. 6)), and an output port. The transmission gate circuit 602 has an input port for receiving the voltage signal VSS, a control port for receiving the recovery signal RCK[1] (e.g., a gate terminal of the N-type transistor receiving the recovery signal RCK[1], and a gate terminal of the P-type transistor receiving the inverted version of the recovery signal RCK[1] (labeled as "$\overline{RCK[1]}$" in FIG. 6)), and an output port. The inverter 608 has a first terminal coupled to the output port of the transmission gate circuit 600, the output port of the transmission gate circuit 602, and a drain terminal of the N-type transistor 620, and a second terminal arranged to transmit an output result of the inverter 608, wherein the N-type transistor 620 determines whether to couple the first terminal of the inverter 608 to the grounding voltage signal GND (or the voltage signal VSS) according to the control signal C3 derived by the NOR gate circuit 500 shown in FIG. 5.

In response to the control signal C3 being at the high level (i.e., both of levels of the recovery signals RCK[0] and RCK[1] are at the low level), the N-type transistor 620 determines to couple the first terminal of the inverter 608 to the grounding voltage signal GND. In response to the control signal C3 being at the low level, the N-type transistor 620 determines not to couple the first terminal of the inverter 608 to the grounding voltage signal GND, and the first terminal of the inverter 608 will receive the voltage signals VC or VSS through the transmission gate circuits 600 or 602 according the levels of the recovery signals RCK[0] and RCK[1].

The signal transmission circuit 601 may be arranged to determine whether to transmit the voltage signal VC or the voltage signal VSS according to the recovery signals RCK[2] and RCK[3]. Specifically, the signal transmission circuit 601 may include multiple transmission gate circuits 604 and 606, an inverter 610, and an N-type transistor 618, wherein each of the transmission gate circuits 604 and 606 may be a CMOS including an N-type transistor and a P-type transistor. The transmission gate circuit 604 has an input port for receiving the voltage signal VC, a control port for receiving the recovery signal RCK[2] (e.g., a gate terminal of the N-type transistor receiving the recovery signal RCK[2], and a gate terminal of the P-type transistor receiving the inverted version of the recovery signal RCK[2] (labeled as "$\overline{\text{RCK[2]}}$" in FIG. 6)), and an output port. The transmission gate circuit 606 has an input port for receiving the voltage signal VSS, a control port for receiving the recovery signal RCK[3] (e.g., a gate terminal of the N-type transistor receiving the recovery signal RCK[3], and a gate terminal of the P-type transistor receiving the inverted version of the recovery signal RCK[1] (labeled as "$\overline{\text{RCK[3]}}$" in FIG. 6)), and an output port. The inverter 610 has a first terminal coupled to the output port of the transmission gate circuit 604, the output port of the transmission gate circuit 606, and a drain terminal of the N-type transistor 618, and a second terminal arranged to transmit an output result of the inverter 610, wherein the N-type transistor 618 determines whether to couple the first terminal of the inverter 618 to the grounding voltage signal GND (or the voltage signal VSS) according to the control signal C6 derived by the NOR gate circuit 502 shown in FIG. 5.

In response to the control signal C6 being at the high level (i.e., both of levels of the recovery signals RCK[2] and RCK[3] are at the low level), the N-type transistor 618 determines to couple the first terminal of the inverter 610 to the grounding voltage signal GND. In response to the control signal C6 being at the low level, the N-type transistor 618 determines not to couple the first terminal of the inverter 610 to the grounding voltage signal GND, and the first terminal of the inverter 610 will receive the voltage signals VC or VSS through the transmission gate circuits 604 or 606 according the levels of the recovery signals RCK[2] and RCK[3].

The NAND gate circuit 614 has a first input port coupled to the second terminal of the inverter 608 for receiving an output result of the signal transmission circuit 603, a second input port coupled to the second terminal of the inverter 610 for receiving an output result of the signal transmission circuit 601, and an output port. The NAND gate circuit 616 has a first input port coupled to the output port of the NAND gate circuit 614 for receiving an output result of the NAND gate circuit 614, a second input receiving the voltage signal VC, and an output port. The inverter 612 has a first terminal coupled to the output port of the NAND gate circuit 616 and a second terminal, wherein the inverter 612 may be arranged to generate an inverted version of an output result of the NAND gate circuit 616 at the second terminal, for acting as the recovered clock signal RCLK.

As a result, the signal recovery circuit 106/300 may perform the signal recovery operation upon the frequency-divided clock signals CK[0]-CK[3] by the logical circuit configurations to generate the recovered clock signal RCLK. Similarly, the signal recovery circuit 108 may perform the signal recovery operation upon the frequency-divided DQS signals DQS[0]-DQS[3] by the same logical circuit configurations of the signal recovery circuit 106/300 to generate the recovered DQS signal RDQS. For example, the logical combination circuit 301 may be modified to receive the frequency-divided DQS signals DQS[0] and DQS[1] for generating a recovery signal RDS[0], the logical combination circuit 303 may be modified to receive the frequency-divided DQS signals DQS[1] and DQS[2] r generating a recovery signal RDS[1], the logical combination circuit 401 may be modified to receive the frequency-divided DQS signals DQS[2] and DQS[3] for generating a recovery signal RDS[2], and the logical combination circuit 403 may be modified to receive the frequency-divided DQS signals DQS[3] and DQS[0] for generating a recovery signal RDS [3]. The control ports of the transmission gate circuits 600, 602, 604, and 606 may be modified to receive the recovery signals RDS[0]-RDS[3], respectively, and the inverter 612 may be arranged to generate an inverted version of an output result of the NAND gate circuit 616, for acting as the recovered DQS signal RDQS. For brevity, further descriptions for the operations of the signal recovery circuit 108 are not repeated in detail here.

In summary, compared with a case where a clock signal and a DQS signal are used to perform a write leveling operation through multiple delay circuits (e.g., multiple inverters) that imitate a delay of a normal data writing path, the signal recovery system of the present invention performs the write leveling operation by frequency division within the DDR SDRAM and signal recovery operations performed upon frequency-divided signals, which can avoid errors caused by process, voltage, and temperature (PVT) variation for the delay circuits (e.g., skew margin reduction between the DQS signal and the clock signal during a data writing operation). In this way, the accuracy of the data writing operation can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal recovery system, comprising:
   multiple frequency dividers, arranged to perform a frequency dividing operation upon a clock signal and a data strobe signal, respectively, to generate a set of frequency-divided clock signals and a set of frequency-divided data strobe signals;
   multiple signal recovery circuits, arranged to perform a signal recovery operation upon the set of frequency-divided clock signals and the set of frequency-divided data strobe signals, respectively, to generate a recovered clock signal and a recovered data strobe signal; and
   a data signal generating circuit, arranged to generate a data signal according to the recovered clock signal and the recovered data strobe signal, for indicating whether a rising edge of the data strobe signal is located at a first level or a second level of the clock signal, wherein the first level is higher than the second level.

2. The signal recovery system of claim 1, wherein the set of frequency-divided clock signals comprises a first frequency-divided clock signal, a second frequency-divided clock signal, a third frequency-divided clock signal, and a fourth frequency-divided clock signal.

3. The signal recovery system of claim 2, wherein the first frequency-divided clock signal is generated according to a first rising edge of a corresponding signal before the frequency dividing operation the set of frequency-divided clock signals, the second frequency-divided clock signal is generated according to a first falling edge of the corresponding signal, the third frequency-divided clock signal is generated according to a second rising edge of the corresponding signal, and the fourth frequency-divided clock signal is generated according to a second falling edge of the corresponding signal.

4. The signal recovery system of claim 3, wherein the multiple signal recovery circuits are arranged to generate multiple recovery signals according to rising edges of the multiple frequency-divided clock signals.

5. The signal recovery system of claim 4, wherein the multiple recovery signals comprise a first recovery signal, a second recovery signal, a third recovery signal, and a fourth recovery signal.

6. The signal recovery system of claim 5, wherein the first recovery signal is generated according to rising edges of the first frequency-divided clock signal and the second frequency-divided clock signal; the second recovery signal is generated according to rising edges of the second frequency-divided clock signal and the third frequency-divided clock signal; the third recovery signal is generated according to rising edges of the third frequency-divided clock signal and the fourth frequency-divided clock signal; and the fourth recovery signal is generated according to rising edges of the first frequency-divided clock signal and the fourth frequency-divided clock signal.

7. The signal recovery system of claim 6, wherein one of the multiple signal recovery circuits comprises multiple logical combination circuits, and each of the multiple logical combination circuits corresponds to two of the frequency-divided clock signals, and comprises:

a first NAND gate circuit, having a first input port for receiving the first frequency-divided clock signal through multiple first inverters, a second input port for receiving an inverted version of the second frequency-divided clock signal through at least one second inverter, and an output port, wherein one of the multiple recovery signals is generated according to the output port.

8. The signal recovery system of claim 7, wherein the one of the multiple recovery signals toggles from a third level to a fourth level in response to a rising edge of the first frequency-divided clock signal, and toggles from the fourth level to the third level in response to a rising edge of the second frequency-divided clock signal; and the third level is lower than the fourth level.

9. The signal recovery system of claim 8, wherein a number of the multiple first inverters is larger than a number of the at least one second inverter.

10. The signal recovery system of claim 7, wherein the one of the multiple signal recovery circuits further comprises:

a first signal transmission circuit, arranged to determine whether to transmit a first voltage signal or a second voltage signal according to the first recovery signal and the second recovery signal, wherein a level of the first voltage signal is higher than a level of the second voltage signal;

a second signal transmission circuit, arranged to determine whether to transmit the first voltage signal or the second voltage signal according to the third recovery signal and the fourth recovery signal;

a second NAND gate circuit, having a first input port for receiving an output result of the first signal transmission circuit and a second input port for receiving an output result of the second signal transmission circuit;

a third NAND gate circuit, having a first input port for receiving an output result of the second NAND gate circuit and a second input port for receiving the first voltage signal; and a third inverter, arranged to generate an inverted version of an output result of the third NAND gate circuit as the recovered clock signal.

11. The signal recovery system of claim 10, wherein the first signal transmission circuit comprises:

a first transmission gate circuit, having an input port for receiving the first voltage signal, a control port for receiving the first recovery signal, and an output port;

a second transmission gate circuit, having an input port for receiving the second voltage signal, a control port for receiving the second recovery signal, and an output port; and a fourth inverter, having a first terminal coupled to the output port of the first transmission gate circuit, the output port of the second transmission gate circuit, and a drain terminal of an N-type transistor, and a second terminal arranged to transmit an output result of the fourth inverter, wherein the N-type transistor determines whether to couple the first terminal of the fourth inverter to the second voltage signal according to a control signal.

12. The signal recovery system of claim 11, wherein the one of the multiple signal recovery circuits further comprises:

a NOR gate circuit, having a first input port for receiving an inverted version of the output result of the first NAND gate circuit corresponding to the first recovery signal and a second input port for receiving an inverted version of the output result of the first NAND gate circuit corresponding to the second recovery signal, wherein an output result of the NOR gate circuit acts as the control signal.

13. The signal recovery system of claim 10, wherein the second signal transmission circuit comprises:

a first transmission gate circuit, having an input port for receiving the first voltage signal, a control port for receiving the third recovery signal, and an output port;

a second transmission gate circuit, having an input port for receiving the second voltage signal, a control port for receiving the fourth recovery signal, and an output port; and a fourth inverter, having a first terminal coupled to the output port of the first transmission gate circuit, the output port of the second transmission gate circuit, and a drain terminal of an N-type transistor, and a second terminal arranged to transmit an output result of the fourth inverter, wherein the N-type transistor determines whether to couple the first terminal of the fourth inverter to the second voltage signal according to a control signal.

14. The signal recovery system of claim 13, wherein the one of the multiple signal recovery circuits further comprises:

a NOR gate circuit, having a first input port for receiving an inverted version of the output result of the first NAND gate circuit corresponding to the third recovery signal and a second input port for receiving an inverted version of the output result of the first NAND gate circuit corresponding to the fourth recovery signal, wherein an output result of the NOR gate circuit acts as the control signal.

15. A storage device, comprising:

a memory controller;

a memory, comprising:

multiple frequency dividers, arranged to receive a clock signal and a data strobe signal from the memory controller, and perform a frequency dividing operation upon the clock signal and the data strobe signal, respectively, to generate a set of frequency-divided clock signals and a set of frequency-divided data strobe signals;

multiple signal recovery circuits, arranged to perform a signal recovery operation upon the set of frequency-divided clock signals and the set of frequency-divided data strobe signals, respectively, to generate a recovered clock signal and a recovered data strobe signal; and a data signal generating circuit, arranged to generate a data signal according to the recovered clock signal and the recovered data strobe signal, and transmit the data signal to the memory controller, for indicating whether a rising edge of the data strobe signal is located at a first level or a second level of the clock signal, wherein the first level is higher than the second level.

* * * * *